United States Patent [19]

Adachi et al.

[11] Patent Number: 4,993,148

[45] Date of Patent: Feb. 19, 1991

[54] METHOD OF MANUFACTURING A CIRCUIT BOARD

[75] Inventors: Kohei Adachi; Mitsuyuki Takada; Atsushi Endo; Eishi Gofuku; Hayato Takasago, all of Hyogo, Japan

[73] Assignee: Mitsubishi Denki Kabushiki Kaisha, Tokyo, Japan

[21] Appl. No.: 406,401

[22] Filed: Sep. 12, 1989

Related U.S. Application Data

[62] Division of Ser. No. 195,635, May 17, 1988.

[30] Foreign Application Priority Data

| May 19, 1987 | [JP] | Japan | 62-74892 |
| May 19, 1987 | [JP] | Japan | 62-74893 |
| May 19, 1987 | [JP] | Japan | 62-74894 |

[51] Int. Cl.$^5$ .............................. H05K 3/30
[52] U.S. Cl. ................... 29/832; 361/388; 174/252; 174/255; 174/260
[58] Field of Search ............ 29/832, 840; 174/252, 174/255, 260; 361/386, 388, 400, 401

[56] References Cited

U.S. PATENT DOCUMENTS

| 3,793,064 | 2/1974 | Budd et al. ........................ 29/832 |
| 4,498,121 | 2/1985 | Breedis et al. ..................... 361/401 |
| 4,544,989 | 10/1985 | Nakabu ............................... 361/386 |
| 4,682,414 | 7/1987 | Butt .................................. 29/832 |
| 4,737,395 | 4/1988 | Mabuchi et al. .................... 174/255 |
| 4,811,166 | 3/1989 | Alvarez et al. ..................... 361/386 |

FOREIGN PATENT DOCUMENTS 2413016  8/1979  France ............................... 361/386

OTHER PUBLICATIONS

Electronic Materials: "Double-Sided Printed Circuit Board with Plated Through-Holes", by Takeshi Kano and Muhahiko Fukushima, Oct. 1986, pp. 72-77.

Primary Examiner—P. W. Echols
Attorney, Agent, or Firm—Lowe, Price, LeBlanc, Becker & Shur

[57] ABSTRACT

A method is provided for forming a circuit board which comprises a copper plate and an insulating layer of photosensitive polyimide resin formed on the copper plate, the insulating layer leaving an exposed portion of a surface of the copper plate where an LSI is to be mounted. After Au plating is applied to the exposed surface of the copper plate, the LSI is mounted fixedly. A connection pattern having bonding pads is formed by copper plating on the insulating layer. The bonding pads and the LSI are connected by Au wire bonding on the Au plating applied on the bonding pads.

12 Claims, 5 Drawing Sheets

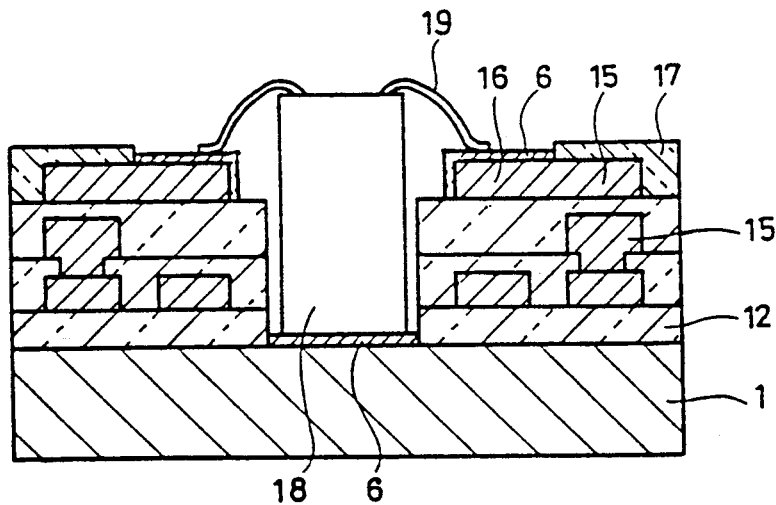
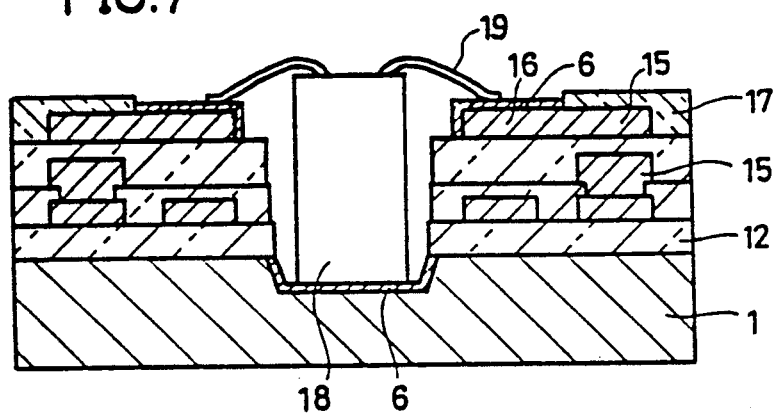
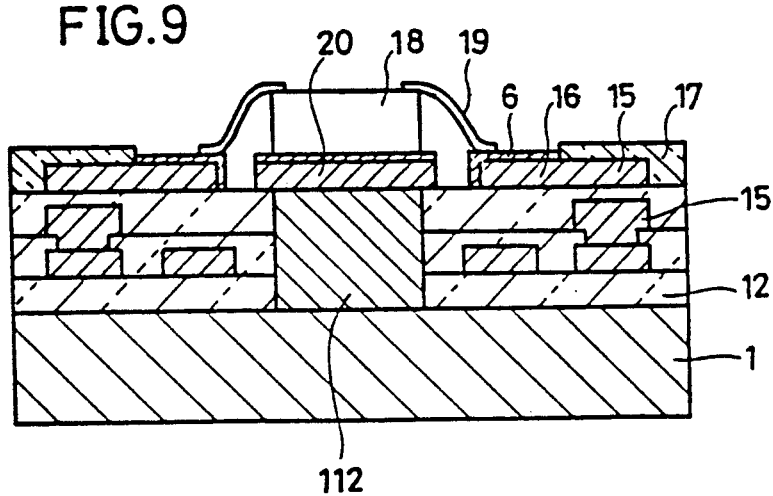

METHOD OF MANUFACTURING A CIRCUIT BOARD

This application is a division of application Ser. No. 07/195,635 filed May 17, 1988.

BACKGROUND OF THE INVENTION

1. Field of the Invention

The present invention relates to a circuit board and particularly to a circuit board using a metal substrate, having excellent heat dissipating characteristics enabling high-density mounting of semiconductor devices or chip components for an integrated circuit (IC), a large-scale integrated circuit (LSI) or the like, as well as a method of manufacturing thereof.

2. Description of the Prior Art

There is an increasing demand, these days, for high-density assembly of electronic components in various fields of electronic equipment. In consequence, it becomes important how to efficiently remove heat generated from the electronic components mounted on a circuit board.

Organic high polymer materials such as paper phenol, glass epoxy or glass polyimide or inorganic materials such as alumina are conventionally used as circuit board materials. However, any of those materials has insufficient thermal conductivity, which causes limitations in coping with increase of a calorific density caused by heat emitted from the electronic components. A circuit board using, as a substrate, a metallic plate having excellent heat resistance and heat dissipation characteristics has been developed to solve this problem.

FIG. 1 is a sectional view showing a conventional circuit board using a metal substrate on which a semiconductor device is mounted. Referring to FIG. 1, an adhesive material 2 to be an insulating layer is placed on a metal substrate 1. A conductor pattern 3 of copper foil is formed on the adhesive material 2. A junction pad 4 comprises a die pad 42 and bonding pads 41 and it is selectively formed on the adhesive material 2. Resist 5 is formed on the conductor pattern 3 only in portions where a surface metallizing process does not need to be applied. An organic high polymer material such as epoxy or polyimide is used as the adhesive material 2. Various techniques are applied conventionally to the adhesive material 2. For example, inorganic filler is contained in the adhesive material 2 to improve thermal conductivity of the adhesive material 2, or prepreg obtained by permeation of semihard resin in glass fabric is used to make the thickness uniform and to suppress occurrence of voids. The thickness of the adhesive material 2 needs to be about 20 to 100 μm in order to ensure electric insulation between the metal substrate 1 and the conductor pattern 3.

The metal substrate 1 has preferably as large a coefficient of thermal conductivity as possible and copper, copper alloy, aluminum, aluminum alloy, iron, iron alloy or the like of 0.5 to 3 mm in thickness is used. The circuit pattern including the conductor pattern 3 and the junction pad 4 is obtained by a process of forming resist pattern on the copper foil and etching the copper foil. A surface metallizing process suitable for a junction method of a semiconductor device to be mounted thereon, for example, a metallizing process of Au, Ni, Ni/Au or soft solder is applied to the die pad 42 and the bonding pads 41 of the junction pad 4, as required. A method of forming a junction of an electronic component 18 such as a semiconductor device to the die pad 42 includes an adhesion method using a conductive or non-conductive material, an alloy junction method using soft solder or Au-Si, and the like. Connection between the electronic component 18 and the bonding pads 41 is made by lead wires 19 through a metallized layer 6 formed on the bonding pads 41.

FIG. 2 is a sectional view showing a conventional board including connection layers on both sides of the metal substrate 1. Copper foil layers 7 are placed on both surfaces of the metal substrate 1 perforated in advance through the adhesive material 2 that acts as an insulating layer, and those are integrally formed as a unitary body. Through holes 8 are formed in the perforated portion filled with the adhesive material 2, penetrating the respective copper foil layers 7. A conductor layer 10 is selectively formed on the adhesive material 2 through the copper foil 7. A heat emitting electronic component 18 has lead pins 21 inserted in the through holes 8 corresponding thereto and it is soldered by a flow soldering method or the like so as to be mounted fixedly on the circuit board.

FIG. 3 is a sectional view showing a conventional board including multilayer connection layers on the metal substrate 1. A multilayer substrate 9 having conductor layers 10 including inner layers and outer layers as well as through holes 8 is placed on the metal substrate 1 by means of the adhesive material 2, thereby to form a unitary body. An electronic component 18 (such as a flat pack IC or a chip carrier) to be mounted on the surface is connected to the surface of the multilayer substrate 9 through the conductor layers 10 by means of solder 22.

A circuit board technology using a metal substrate is described for example in "Electronic Materials", 1986 Oct. issue, pp. 72-77. Particularly, for a circuit board using through holes, this journal indicates an example in which an aluminum substrate is used as a substrate where light emitting diodes (LEDs) are mounted, thereby to solve the problem of insufficient heat dissipation in the case of high-density mounting of LEDs.

In the conventional circuit board using the metal substrate, a connection circuit is formed on the metal substrate through an insulating layer having lower thermal conductivity as described above. Consequently, heat dissipation from a heat generating component mounted on the pad to the metal substrate is insufficient and if IC or LSI devices having a large calorific quantity are mounted with high density, the heat dissipation characteristic is insufficient and the temperature in the devices increases excessively, causing deterioration in the properties of the devices and problems in the associated equipment. In addition, in such a case, the quality of the adhesive material of the insulating layer is deteriorated due to the temperature rise and the electric insulation thereof is lowered. Further, thermal stress is caused by a difference of thermal expansion coefficients of the materials constituting the substrate as a result of temperature changes in the devices due to turn-on and turn-off of the equipment, resulting in lowering of adhesion intensity or detachment between the insulating layer (the adhesive material) and the metal substrate, or between the insulating layer (the adhesive material) and the copper foil.

SUMMARY OF THE INVENTION

The present invention has been accomplished to solve the above described problems. Therefore, an object of the present invention is to provide a circuit board using a metal substrate which has an excellent characteristic of heat dissipation and accordingly makes it possible to suppress rise of temperature of an electronic component mounted thereon and to prevent deterioration of the properties of the electronic component, thereby to ensure reliability for a long period in an apparatus where the circuit board is incorporated.

Another object of the present invention is to provide a circuit board, using a metal substrate, which makes it possible to prevent deterioration in adhesion and electric insulation between an insulating layer and the metal substrate.

A circuit board in an aspect of the present invention comprises a metal substrate, an insulating layer and a conductor layer. The insulating layer is selectively formed with space on a major surface of the metal substrate, the major surface of the metal substrate being exposed in the space to enable at least an electronic component to be mounted thereon. The conductor layer is selectively formed with space on the insulating layer in accordance with a predetermined pattern, so as to connect at least electrically the electronic component.

Preferably, the major surface of the metal substrate exposed between the respective insulating layer regions has a recessed portion. In addition, the insulating layer preferably contains therein one or more conductor layers formed selectively with space in accordance with a predetermined pattern. The electronic component is preferably connected to the major surface of the metal substrate exposed between the respective insulating layer regions through a metallized layer so that it is mounted fixedly on the metal substrate. Further, conductors are preferably connected to the conductor layer through the metallized layer and fixed to the electronic component. The electronic component may include at least a semiconductor device.

A circuit board in another aspect of the present invention comprises a metal substrate, an insulating layer, a metal layer, and a conductor layer. The insulating layer is selectively formed with at least one open space therein on a major surface of the metal substrate. The metal layer at least fills the portions between the respective insulating layer regions where the major surface of the metal substrate is exposed, so that at least an electronic component is mounted on the metal layer. The conductor layer, likewise, is selectively formed with an open space therein on the insulating layer and the metal layer in accordance with a predetermined pattern, so that the electronic component is at least electrically connected.

The insulating layer preferably contains one or more conductor layers formed selectively each with an open formed therein space. The electronic component is preferably connected to the conductor layer on the metal layer through a metallized layer formed thereon so as to be mounted fixedly. In addition, conductors are preferably connected to the conductor layer formed on the insulating layer through the metallized layer and fixed to the electronic component. The electronic component may include at least a semiconductor device.

A method of manufacturing a circuit board in an aspect of the present invention comprises below described steps. First, a metal substrate is provided. An insulating layer is selectively formed, with at least one open space therein, on a major surface of the metal substrate. As a result, the major surface of the metal substrate is exposed between respective insulating layer regions to enable at least an electronic component to be mounted thereon. A conductor layer is selectively formed, with an open space, on the insulating layer in accordance with a predetermined pattern. Thus, the conductor layer enables the electronic component to be at least electrically connected.

Preferably, the insulating layer is formed to have a recessed portion on the exposed major surface of the metal substrate. The insulating layer is preferably formed to contain therein one or more conductor layers formed selectively, each with an open space therein in accordance with a predetermined pattern. In addition, the method of manufacturing the circuit board may comprise the step of connecting an electronic component on the exposed major surface of the metal substrate between the respective insulating layer regions through a metallized layer and mounting fixedly the electronic component thereon. In this case, connection and fixed mounting of the electronic component are preferably made by using a conductive adhesive material or an insulating adhesive material.

A method of manufacturing a circuit board in another aspect of the present invention comprises below described steps. First, a metal substrate is provided. An insulating layer is selectively formed with an open space therein on a major surface of the metal substrate. A metal layer is formed to fill at least the exposed portions of the major surface of the metal substrate between the respective insulating layer regions. Thus, the metal layer is formed to enable at least an electronic component to be mounted thereon. A conductor layer is selectively formed, with an open space on the insulating layer and the metal layer in accordance with a predetermined pattern. Thus, the conductor layer enables the electronic component to be at least electrically connected.

Preferably, the metal layer is formed to be even with the insulating layer. The insulating layer is preferably formed to contain therein one or more conductor layers formed selectively each with an open space therein, in accordance with a predetermined pattern. In addition, the method of manufacturing the circuit board preferably comprises the step of connecting the electronic component on the metal layer through the conductor layers and metallized layers formed thereon and fixedly mounting the electronic component on the metal layer. In this case, connection and fixed mounting of the electronic component are preferably made by using a conductive adhesive material or an insulating adhesive material.

In the circuit board using the metal substrate according to the present invention, an insulating layer inferior in thermal conductivity is not interposed between a heat emitting electronic component and the metal substrate and the heat generated from the electronic component is directly transmitted to the metal substrate. Accordingly, even if an insulating adhesive material is interposed between the electronic component and the metal substrate, better heat dissipation is exhibited compared with the conventional case in which an insulating adhesive material is provided on the insulating layer. Consequently, it becomes possible to suppress temperature rise in the electronic component and to ensure reliability of the apparatus concerned for a long period. In addition, since the circuit board of the present invention has an excellent heat dissipation characteristic for a high-density multiple chip mounting, temperature rise can be made uniform and a local rise of temperature never occurs. Furthermore, deterioration of the insulating layer due to temperature rise can also be prevented and it is possible to prevent lowering of electric insulation. It is also possible to reduce thermal stress and to avoid lowering of adhesive intensity between the insulating layer and the metal substrate.

If the electronic component is mounted in the recessed portion formed on the metal substrate, a part of the electronic component is contained in an inner portion of the metal substrate and thus the circuit board can be made thin.

In addition, in the circuit board of the present invention, the metal layer fills the gap corresponding to the level difference between the metal substrate and the insulating layer without deteriorating the thermal conductivity. Accordingly, work for forming connections or forming resist between the metal substrate and the insulating layers can be effected efficiently and mismatch in patterning can be prevented.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a sectional view showing a variant of the circuit board of FIG. 4E.

FIG. 7 is a sectional view showing a variant of the circuit board of FIG. 6E.

FIG. 9 is a sectional view showing a variant of the circuit board of FIG. 8E.

DESCRIPTION OF THE PREFERRED EMBODIMENTS

Embodiment A

FIGS. 4A to 4E are sectional views showing successively steps of manufacturing a circuit board using a metal substrate according to an embodiment of the present invention.

Figure 1:
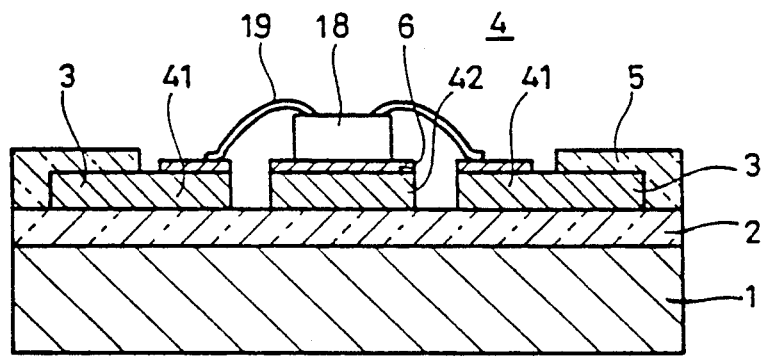
FIG. 1 is a sectional view showing an example of a structure of a conventional circuit board using a metal substrate.
Figure 2:
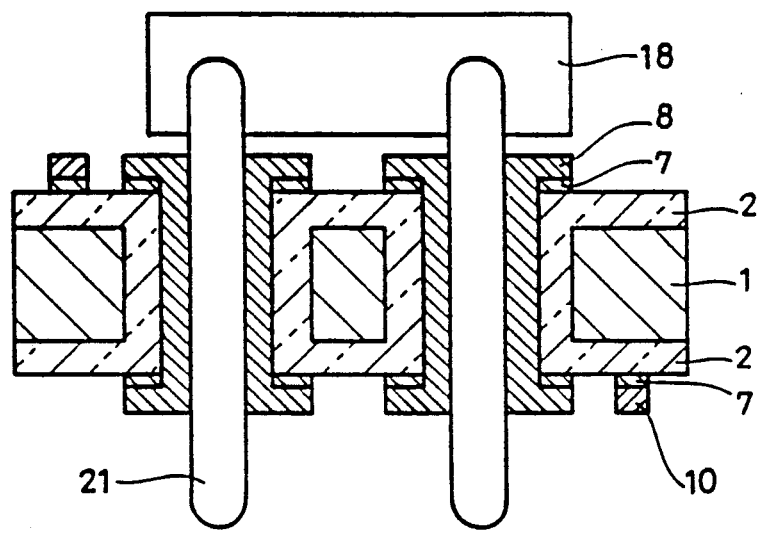
FIG. 2 is a sectional view showing an example of a structure of a conventional circuit board using a metal substrate where through holes are formed.
Figure 3:
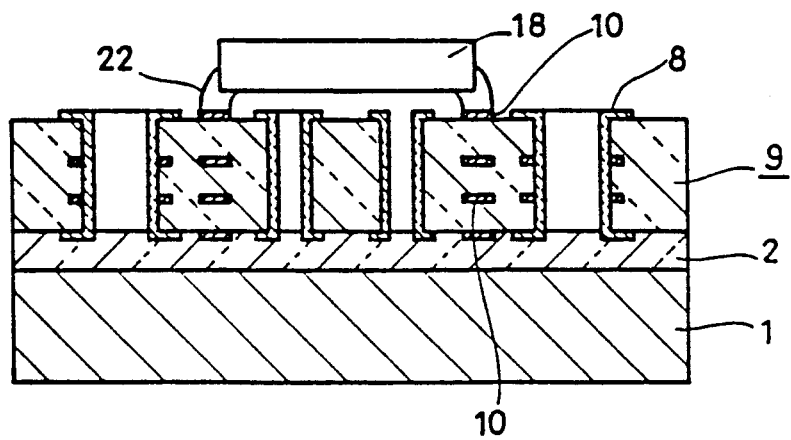
FIG. 3 is a sectional view showing an example of a structure of a conventional circuit board using a metal substrate, an electronic component being mounted on its surface.
Figure 4A:
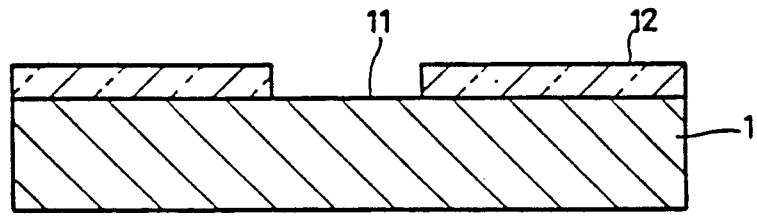
FIGS. 4A to 4E are sectional views successively showing steps in the process manufacturing of a circuit board in accordance with an embodiment of the present invention.

Referring to FIG. 4A, in manufacturing the circuit board, an insulating layer 12 is formed in accordance with a predetermined pattern with an exposed metal portion 11 being left at the desired position and in a desired form on a metal substrate 1 having a rough surface. The insulating layer 12 is formed by an organic high polymer resin such as a photosensitive or non-photosensitive polyimide or epoxy material. The insulating layer 12 is patterned by a photolithographic process in the case of a photosensitive organic high polymer resin, or by a screen printing process in the case of a non-photosensitive organic high polymer resin.

Figure 4B:
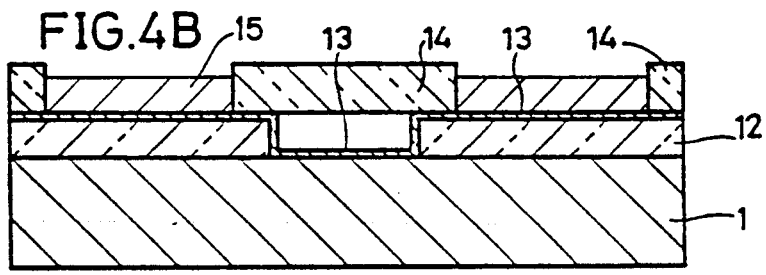

Next, referring to FIG. 4B, a metal film 13 is formed on the insulating layer 12 and the metal substrate 1 by any of an electroless plating process, a sputtering process, an evaporation process and the like. Then, plating resist 14 is formed in a predetermined pattern using a dry film or a liquid resist.

Figure 4C:
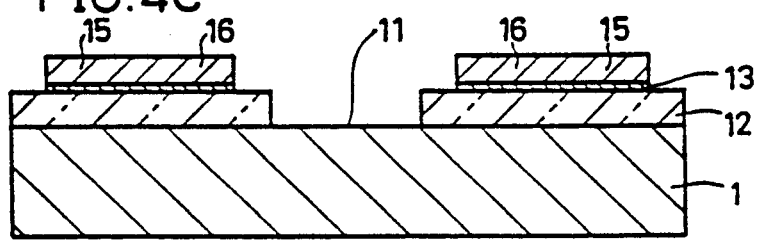

Electroplating is applied to portions on the metal film 13 not covered with the plating resist 14, so that those portions are filled with the electroplate having a necessary thickness. After removal of the plating resist 14, soft etching is applied, so that the metal film 13 that had been covered with the plating resist 14 is melted and removed. Thus, as shown in FIG. 4C, a connection pattern including a conductor pattern 15 and bonding pads 16 is formed on the insulating layer 12.

Figure 4D:
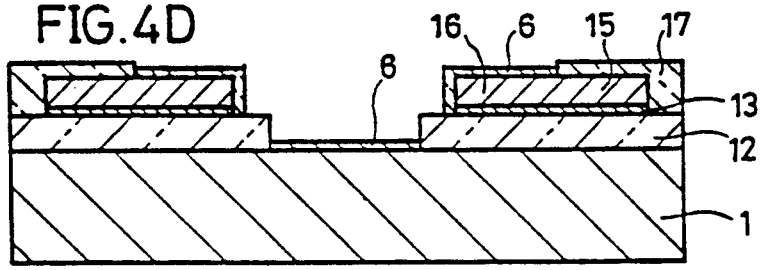

Then, as shown in FIG. 4D, resist 17 is deposited on the connection pattern, only in portions where surface metallizing treatment is not required. After that, surface metallizing treatment such as plating of Au, Ni, Sn or the like, or solder coating is applied on the connection pattern not covered with the resist 17, so that a metallized layer 6 is selectively formed on the connection pattern.

Figure 4E:
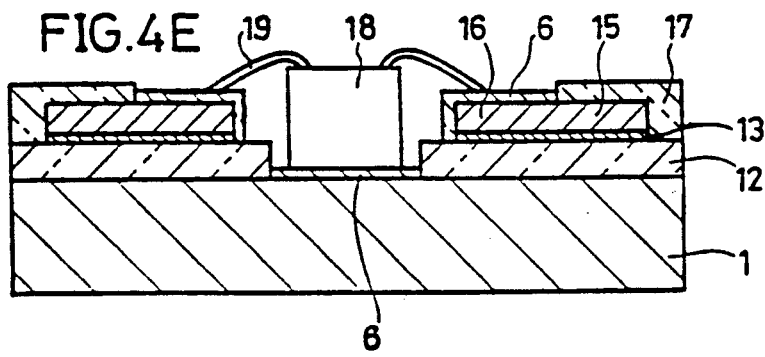

Referring to FIG. 4E, an electronic component 18, i.e., a semiconductor device in this case, is joined on the exposed metal portion 11 through the metallized layer 6 and the electronic component 18 and the bonding pads 16 are connected by lead wires 19 through the metallized layer 6. The method of forming a junction between the electronic component 18 and the metal substrate is for example an adhesion method using a conductive adhesive material such as silver paste or a non-conductive adhesive material such as epoxy resin, or an alloy junction method.

FIG. 5 shows a variant of the structure shown in FIG. 4E, where a circuit board using a metal substrate and having three insulating layers is shown in section. The multiple layers are obtained by repeating the steps shown in FIGS. 4A to 4C a required number of times. In this variant, a conductor pattern 15 is embedded in the three insulating layers 12. A connection pattern including the conductor pattern 15 and the bonding pads 16 is formed on the uppermost insulating layer 12. The electronic component 18 is mounted fixedly on the metal substrate 1 through the metallized layer 6, the electronic component 18 and the bonding pads 16 being connected by lead wires 19 through the metallized layer 6.

In the following, a detailed description is provided of a concrete example of a method of manufacturing the circuit board shown in FIGS. 4A to 4E in accordance with the embodiment A of the present invention.

Example A1:

A copper plate of 0.5 to 3 mm in thickness was subjected to rough surface finishing, so as to be a metal substrate 1, by using a polishing roll. Alkali degreasing and acid pickling were applied to the metal substrate 1. Then, photosensitive polyimide resin was coated over the whole surface of the metal substrate 1 and a prebake process was applied thereto. After that, exposure and development processes and a heat curing process were applied thereto. Thus, an insulating layer 12 was formed with a thickness of the resin after the curing being 5 to 20 μm and an exposed metal portion 11 having an area of 0.1 to 10 mm in diameter. A Pd plating base was formed over the whole surface of the insulating layer 12 by using an activation treatment liquid on sale and after that a copper film of 1000 to 5000 Å in thickness as a metal film 13, was deposited on the insulating layer 12 and the metal substrate 1 by an electroless plating process. Then, a dry film to serve as a plating resist 14 was formed in accordance with a predetermined pattern and electroplating was applied by using a copper sulfate plating liquid to form a plating of 5 to 20 μm in thickness. After the plating resist 14 was removed, the metal film 13 of the electroless plated copper film was etched with dilute sulfuric acid, whereby connection patterns 15 and 16 were formed. In this example, heat treatment at 200° C. was applied for an hour after the electroplating, whereby a conductor adhesion intensity of more than 2.5 kg/mm$^2$ was obtained. Further, a resist 17 was formed on the connection patterns in only the predetermined areas and, after that, Ni plating and then Au plating were applied onto the exposed metal portion 11 and the bonding pads 16 by using a commercially available electroless plating liquid to form a metallized layer 6.

A semiconductor device, e.g., an electronic component 18, was adhered on the exposed metal portion 11 by using silver paste and Au wires of 25 μm in diameter, i.e., lead wires 19, were connected therewith by wire bonding. Thus, a bonding intensity of more than 7 g was obtained. As for heat radiation of a circuit board, an experiment was conducted in a manner in which 25 LSI's were mounted on a board of 100 mm × 100 mm and heat was generated with the maximum power consumption of 100 W. It was found as a result that no such problem as in a conventional circuit board using a metal substrate occurred because of good heat dissipation since the heat was directly transmitted to the copper plate. Thus, temperature rise in the LSI's was lessened because of the good heat dissipation. Accordingly, it was possible to prevent deterioration of the properties of the LSI's and a long-period reliability of the associated apparatus was obtained.

In addition, since deterioration of the insulating layer was also able to be prevented, no degradation in electric insulation was found. The adhesion between the insulating layer and the copper plate was good. Moreover, since temperature rise was able to be made uniform even in the case of a high-density multiple chip mounting of semiconductor devices, a long-period reliability of the apparatus was obtained and the circuit board thus obtained was suitable as a module board or a multiple chip mounting board industrially applicable in various fields.

Embodiment B

FIGS. 6A to 6E are sectional views showing successively steps in the process of manufacturing a circuit board using a metal substrate in accordance with another embodiment of the present invention.

Figure 6A:
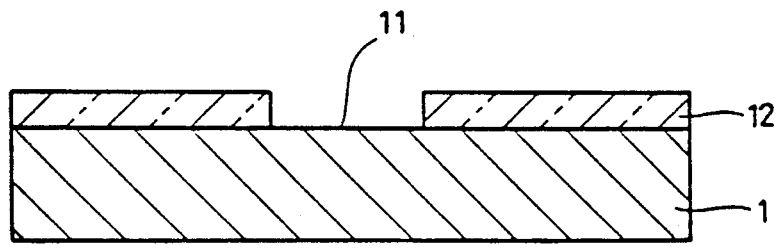
FIGS. 6A to 6E are sectional views successively showing steps in the process manufacturing of a circuit board in accordance with another embodiment of the present invention.

First, referring to FIG. 6A, an insulating layer 12 is formed at a desired position and in a desired form on a roughly finished metal substrate 1 in accordance with a predetermined pattern with a metal portion 11 being exposed. The insulating layer 12 is formed by an organic high polymer resin such as a photosensitive or non-photosensitive polyimide or epoxy material. The insulating layer 12 is patterned by a photolithographic process in the case of a photosensitive organic high polymer resin or by a screen printing process in the case of a non-photosensitive organic high polymer resin.

Figure 6B:
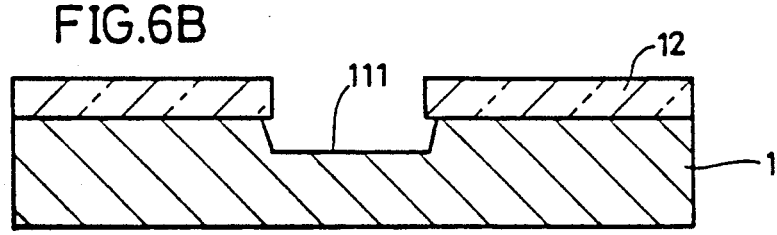

Then, as shown in FIG. 6B, the exposed metal portion 11 of the metal substrate 1 is melted or cut to a desired depth by etching or machining, so that a recessed portion 111 for mounting of a component is formed.

Figure 6C:
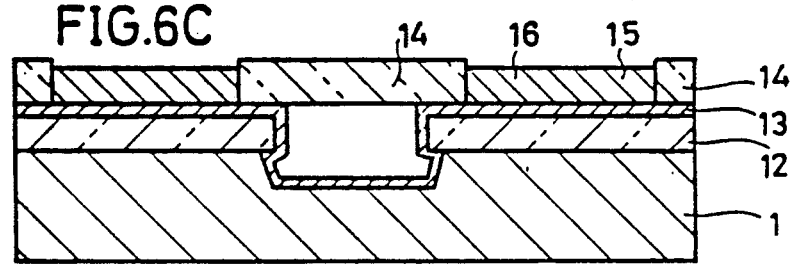

Referring to FIG. 6C, a metal film 13 is formed on the insulating layer 12 and the recessed portion 111 by any of an electroless plating process, a sputtering process, an evaporation process and the like. Thereafter, plating resist 14 is formed with a predetermined pattern by using a dry film or a liquid resist. Then, electroplating is applied to a necessary thickness on the metal film 13 not covered with the plating resist 14, so that this portion is filled with the electroplate of that thickness.

Figure 6D:
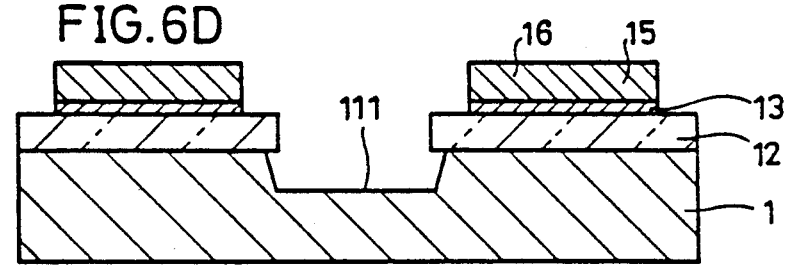

Further, after the plating resist 14 is removed, the metal film 13 that had been covered with the plating resist 14 is melted and removed by soft etching. Thus, as shown in FIG. 6D, a connection pattern including a conductor pattern 15 and bonding pads 16 is formed on the insulating layer 12.

Figure 6E:
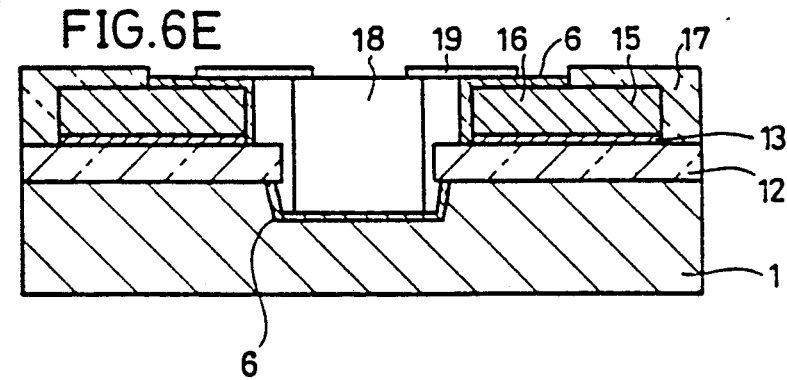

Referring to FIG. 6E, resist 17 is formed on the connection pattern, as required, only in portions where surface metallizing treatment does not need to be applied. Subsequently, surface metallizing treatment such as plating of Au, Ni, Sn or the like, or solder coating is applied to the connection pattern not covered with the resist 17, so that a metallized layer 6 is selectively formed on the connection pattern. An electronic component 18, i.e., a semiconductor device in this case is joined on the recessed portion 111 through the metallized layer 6 so as to be mounted fixedly. The electronic component 18 and the bonding pads 16 are connected by lead wires 19 through the metallized layer 6. The junction method therebetween is for example an adhesion method by a conductive adhesive material such as silver paste or a non-conductive adhesive material such as epoxy resin, or an alloy junction method, similarly to the conventional case.

FIG. 7 is a sectional view showing a circuit board using a metal substrate, having three insulating layers, in accordance with a variant of the embodiment having the structure shown in FIG. 6E. In this case, the multiple layers are obtained by repeating alternately the steps of forming an insulating layer and a conduction pattern by a required number of times. In this variant, a conductor pattern 15 is embedded in the three insulating layers 12. A conduction pattern including the conductor pattern 15 and the bonding pads 16 is formed on the uppermost insulating layer. The electronic component 18 is mounted fixedly on the metal substrate 1 through the metallized layer 6 and it is connected with the bonding pads 16 by lead wires 19 through the metallized layer 6.

In the following, concrete examples of methods of manufacturing the circuit board shown in FIGS. 6A to 6E in accordance with the embodiment B of the present invention will be described in detail.

Example B1

Rough surface finishing was applied to a copper plate of 0.5 to 3 mm in thickness as a metal substrate 1 by using a polishing roll. Alkali degreasing and acid pickling were applied to the metal substrate 1. Then, a photosensitive polymide resin was coated on the whole surface of the metal substrate 1 and after prebake treatment was applied thereto, exposure and development processes and a heat curing process were applied thereto. Thus, an insulating layer 12 was formed to have a thickness of 5 to 20 μm after the curing and an area of 2 mm×2 mm to 10 mm×10 mm as an exposed metal portion 11. The exposed metal portion 11 was melted and removed to a depth of 0.2 to 0.5 mm by spray etching of ferric chloride solution, whereby a recessed portion 111 for mounting of a component was formed. Further, a Pd plating base was formed over the whole surface by using a commercially available activation treatment solution and after that a copper film as a metal film 13 was formed over the insulating layer 12 and the recessed portion 111 by electroless copper plating to have a thickness of 1000 to 5000 Å. After a dry film serving as a plating resist 14 was formed on the metal film 13 with a predetermined pattern, electroplating was applied thereto with a thickness of 5 to 20 μm by using copper sulfate solution. After the plating resist 14 was removed, the metal film 13 of the electroless plated copper film was etched by using dilute sulfuric acid, so that connection patterns 15 and 16 were formed. After the electroplating, heat treatment at temperature of 200° C. was applied for an hour, so that a conductor adhesion intensity of more than 2.5 kg/mm$^2$ was obtained. Further, after resist 17 was deposited on predetermined areas, Ni plating and then Au plating were applied to the exposed recessed portion 111 of the copper plate and the bonding pads 16 by using a commercially available electroless plating liquid. Thus, a metallized layer 6 was formed on the recessed portion 111 for component mounting and the bonding pads 16. A semiconductor device as an electronic component 18 was joined on the recessed portion 111 by means of silver paste with its upper surface being substantially on the same plane as the surface of the metallized layer 6 on the bonding pads 16. Thus, the circuit board as shown in FIG. 6E was obtained. In this case, a tape automated bonding (TAB) system was adopted as the bonding method of lead wires 19.

As for heat dissipation of the board, an experiment was conducted in a manner in which 25 LSI's were mounted on a board of 100 mm×100 mm and heat emission was examined with the maximum power consumption of 100 W. It was found as a result that a good heat dissipation characteristic was exhibited since the heat was directly transmitted to the copper plate because of nonexistence of an insulating layer between the LSI's and the copper plate and that no problem as in a conventional circuit board using a metal substrate occured. Thus, temperature rise of the LSI's was able to be reduced because of the good heat dissipation. Consequently, deterioration of the properties of the LSI's was prevented and a long-term reliability was ensured for the apparatus associated therewith.

In addition, deterioration of the insulating layer was also prevented and no degradation of electric insulation was found. The adhesion between the insulating layer and the copper plate was also in good condition. Furthermore, in the case of a high-density multiple chip mounting of semiconductor devices, temperature rise was able to be made uniform and a long-term reliability of the apparatus was obtained. Accordingly, the circuit board thus obtained was industrially to a module board or a multiple chip mounting board.

In addition, according to this example, the semiconductor device was partially contained in the metal substrate and thus it was made possible to make a circuit board have a thin thickness. More specifically, since the electronic component was able to be contained in the recessed portion, the circuit board can be utilized for example as an IC card.

Example B2

Rough surface finishing was applied to a copper plate of 0.5 to 3 mm in thickness as a metal substrate 1 by using a polishing roll. After that, alkali degreasing and acid pickling were applied to the metal substrate 1. Then, heat resisting resist of epoxy was provided on the metal substrate 1 by screen printing and it was thermally cured at temperature of 150° C. for 30 min. Thus, the insulating layer 12 was formed by the resist to have a thickness of 20 to 50 μm with an exposed metal portion of 2 mm× 2 mm to 10 mm× 10 mm being left uncovered. The exposed metal portion 11 of the copper plate was cut by mealing to a depth of 0.2 to 0.5 mm, whereby a recessed portion 111 for mounting of a component was formed. Subsequently, by the same steps as in the above described example B1, a connection pattern was formed on the insulating layer 12 and a semiconductor device as an electronic component 18 was joined thereon. Thus, the circuit board as shown in FIG. 6E was obtained. The circuit board thus obtained exhibited excellent heat dissipation characteristic similarly to the case of the example B1 and produced the same effect.

Embodiment C

FIGS. 8A to 8E are sectional views showing successively steps of manufacturing a circuit board using a metal substrate in accordance with a still further embodiment of the present invention.

Figure 8A:
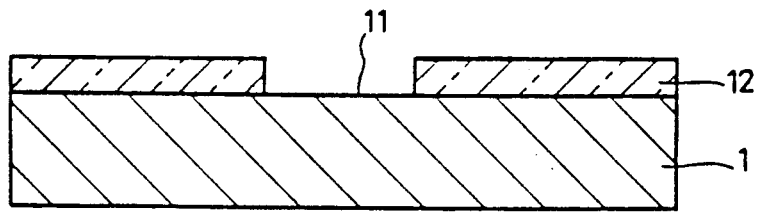
FIGS. 8A to 8E are sectional view successively showing steps in the process of manufacturing of a circuit board in accordance with a still further embodiment of the present invention.

First, referring to FIG. 8A, an insulating layer 12 is formed at a desired position and in a desired form on a roughly finished metal substrate 1 in accordance with a predetermined pattern with an exposed metal portion 11 being left uncovered. The insulating layer 12 is formed by an organic high polymer resin such as a photosensitive or non-photosensitive polyimide or epoxy resin. The insulating layer 12 is patterned by a photolithographic process if it is a photosensitive organic high polymer resin, or by a screen printing process if it is a non-photosensitive organic high polymer resin.

Figure 8B:
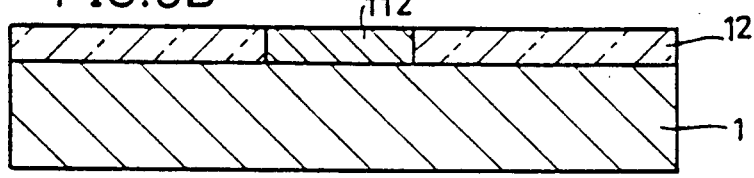

Then, referring to FIG. 8B, metal is filled in the exposed metal portion 11 by a plating process or a printing process, whereby a heat emitting stud 112 is formed.

Figure 8C:
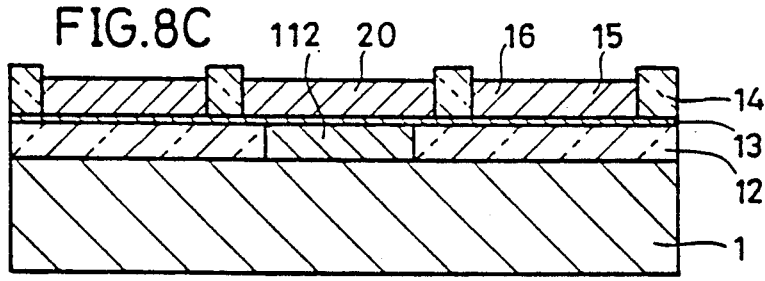

As shown in FIG. 8C, a metal film 13 is formed on the insulating layer 12 and the heat emitting stud 112 by any of such processes as electroless plating, sputtering and evaporation. After that, resist 14 is formed on the metal film 13 with a predetermined pattern by using a dry film or a liquid resist. Electroplating of a required thickness is applied to fill portions on the metal film 13 not covered with the plating resist 14.

Figure 8D:
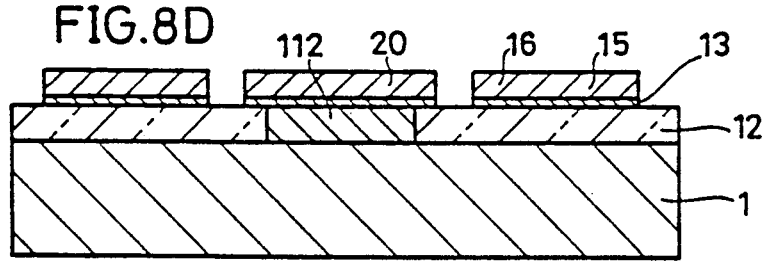

Further, after the plating resist 14 is removed, the metal film 13 that had been covered with the plating resist 14 is melted and removed by soft etching. Thus, as shown in FIG. 8D, a connection pattern including the conductor pattern 15, the bonding pads 16 and a die pad 20 is formed on the insulating layer 12.

Figure 8E:
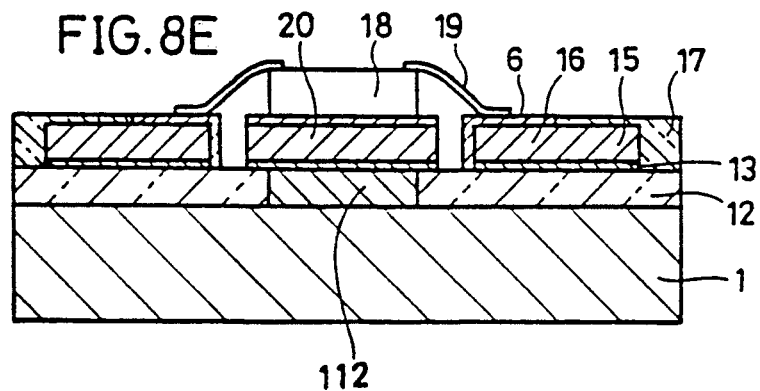

Referring to FIG. 8E, resist 17 is formed on the connection pattern as required, only in portions where surface metallizing treatment does not need to be applied. After that, surface metallizing treatment such as plating of Au, Ni, Sn or the like, or solder coating is applied, so that a metallized layer 6 is selectively formed on the connection pattern. An electronic component 18, i.e., a semiconductor device in this case, is joined on the die pad 20 through the metallized layer 6 so as to be mounted fixedly thereon. The electronic component 18 and the bonding pads 16 are connected by lead wires 19 through the metallized layer 6. The method of forming a junction therebetween in this case is, for example, an adhesion method using a conductive adhesive material such as silver paste or a non-conductive adhesive material such as epoxy resin, or an alloy junction method.

FIG. 9 is a sectional view showing a circuit board having three insulating layers in accordance with a variant of the structure shown in FIG. 8E. In this case, the multiple layers are obtained by repeating the steps shown in FIGS. 8A to 8D a required number of times. In this variant, a conductor pattern 15 is embedded in the three insulating layers 12. A connection pattern including the conductor pattern 15 and the bonding pads 16 is formed on the uppermost insulating layer 12. The electronic component 18 is mounted fixedly on the die pad 20 through the metallized layer 6 and it is connected with the bonding pads 16 by lead wires 19 through the metallized layer 6.

In the following, concrete examples of methods of manufacturing a circuit board shown in FIGS. 8A to 8E in accordance with the embodiment C of the invention will be described in detail.

Example C1

A copper plate of 0.5 to 3 mm in thickness was subjected to rough surface finishing using a polishing roll so as to be prepared as a metal substrate 1. After that, alkali degreasing and acid pickling were applied to the metal substrate 1. Then, a photosensitive polyimide resin was coated over the whole surface of the metal substrate 1 and after prebake treatment was applied thereto, exposure and development processes and a heat curing process were applied. An insulating layer 12 was formed to have a thickness of 5 to 20 $\mu$m after the curing with an exposed metal portion 11 having an area of 0.1 to 10 mm in diameter. Further, copper plating was applied to the exposed metal portion 11 to a thickness substantially equal to that of the insulating layer 12 of polyimide resin by using a copper sulfate plating liquid with the metal substrate 1 being used as a cathode. As a result, a heat emitting stud 112 of copper was formed to make up the difference of surface levels of the metal substrate 1 and the insulating layer 12, whereby a flat surface was obtained over the whole area. Then, after a Pd plating base was formed over the whole surface by a commercially available activation treatment liquid, a copper film of 1000 to 5000 Å as a metal film 13 was deposited on the insulating layer 12 and the heat emitting stud 112 by electroless plating. After a dry film as a plating resist 14 was formed on the metal film 13 in accordance with a predetermined pattern, electroplating of a thickness of 5 to 20 $\mu$m was applied onto the metal film 13 by a copper sulfate plating liquid. After the plating resist 14 was removed, the metal film 13 of the electroless plated copper film was etched with dilute sulfuric acid, whereby connection patterns 15, 16 and 17 were formed. Then, heat treatment at temperature of 200° C. was applied for an hour after the electroplating, whereby a conductor adhesion intensity of more than 2.5 kg/mm$^2$ was obtained. After resist 17 was formed in predetermined areas on the conduction patterns, Ni plating and then Au plating were applied on the die pad 20 and the bonding pads 16 by a commercially available electroless plating liquid. After a semiconductor device as an electronic component 18 was joined on the die pad 20 by silver paste, Au wires of 25 $\mu$m in diameter as lead wires 19 were bonded. Thus, a bonding intensity of more than 7 g was obtained. As for heat emission of a board, an experiment was conducted in a manner in which 25 LSI's were mounted on a board of 100 mm × 100 mm and heat was generated with the maximum power consumption of 100 W. As a result, it was found that a good heat dissipation characteristic was exhibited, causing no problem as in a conventional circuit board using a metal substrate, since the heat was directly transmitted to the copper plate because of non-existence of an insulating layer between the LSI's and the copper plate. Thus, temperature rise in the LSI's was able to be lessened because of the good heat dissipation characteristic. Accordingly, deterioration of the properties of the LSI's was prevented and a long-term reliability was ensured for the apparatus associated therewith.

In addition, since deterioration of the insulating layer was also prevented, no degradation of electric insulation was found. Further, the adhesion between the insulating layer and the copper plate was excellent. According to this example, termperature rise was made uniform in the case of a high-density multiple chip mounting of semiconductor devices and thus the circuit board ensures a long-term reliability for the apparatus associated therewith and it was applicable to a module substrate or a multiple chip mounting substrate in industrial fields. In addition, since the heat emitting stud was formed of the metal layer and made up the level difference between the copper plate and the insulating layer to obtain a flat surface without deteriorating thermal conductivity, it was made possible to improve work efficiency and to prevent mismatch in patterning at the time of forming connection or resist over the copper plate and the insulating layer.

Example C2

A copper plate of 0.5 to 3 mm in thickness was subjected to rough surface finishing using a polishing roll, whereby a metal substrate 1 was prepared. After that, alkali degreasing and acid pickling were applied to the metal substrate 1. Heat resisting resist of epoxy was provided on the metal substrate 1 by screen printing and heat curing at temperature of 150° C. was applied thereto for 30 min. Thus, an insulating layer 12 of the resist was formed to have a thickness of 20 to 50 $\mu$m with a metal portion of 1 to 10 mm in diameter being left exposed. Then, metal powder paste such as silver paste was printed on the exposed metal portion 11 of the copper plate and heat curing at temperature of 150° C. was applied thereto for 30 min, whereby a heat emitting stud 112 was formed. Subsequently, a connection pattern was formed on the insulating layer 12 and the heat emitting stud 112 in the same steps as in the example C1 and then a semiconductor device was placed thereon. Thus, the circuit board using the metal substrate as shown in FIG. 8E was obtained. The board thus obtained exhibited as good heat dissipation characteristic as in the example C1 and produced the same meritorious effect.

In the above described respective examples, a silver paste (a conductive adhesive material) was used to adhere LSI to the board. However, if an insulating adhesive material such as epoxy resin was used, it was found that good heat dissipation characteristic was exhibited with the same effect as described above compared with a conventional case using an insulating adhesive material on an insulating layer.

In addition, although the copper plate was used as the metal substrate in the above described examples, other materials such as copper alloy, aluminum, aluminum alloy, nickel, nickel alloy, iron or iron alloy may be applicable. In view of thermal conductivity and compatibility with copper plating of the upper conductor connection pattern, copper or copper alloy is most suitable.

As for the material of the insulating layer, the case of using photosensitive polyimide resin was described in the foregoing. However, non-photosensitive polyimide resin or photosensitive or non-photosensitive epoxy resin is also applicable as described previously.

Furthermore, although the circuit pattern was formed by the plating process in the above described respective examples, a circuit pattern may be formed by a dry process such as sputtering evaporation or a screen printing process using conductive paste.

In addition, although only the heat emitting stud was provided in the exposed metal portion in the above described examples, a via-hole for electrically connecting the metal substrate and the upper conductor pattern may be formed simultaneously with the heat emitting stud if another exposed metal portion is formed at a desired position in a desired form. In consequence, the metal substrate can be utilized as a grounding layer or a power supply layer.

As for the heat emitting stud of metal, various metals or metal powder paste such as silver paste may be used other than the metal layer. The heat emitting stud formed by the same metal as the metal substrate makes it possible to provide a board of high reliability because the thermal expansion coefficients of the stud and the metal substrate are equal.

As described above, the present invention makes it possible to provide a circuit board using a metal substrate, having an excellent heat dissipation characteristic to ensure a long-term reliability for an apparatus associated therewith and also having excellent characteristics in adhesion between an insulating layer and a metal substrate and electric insulation, because there is no insulating layer inferior in thermal conductivity interposed between a heat emitting electronic component and the metal substrate. In addition, according to the present invention, an electronic component is mounted in a recessed portion and fitted in a substrate, and thus a circuit board in a packaged state can be made thin.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a circuit board, comprising the steps of:
   preparing a metal substrate having a major surface;
   forming an insulating layer selectively, with at least one open space therein, on the major surface of said metal substrate, to expose the major surface of said metal substrate to enable at least an electronic component to be mounted in the at least one open space of said insulating layer; and
   forming a conductor layer selectively, with at least one open space therein, on said insulating layer in accordance with a predetermined pattern, said conductor layer being formed to enable said electronic component to be at least electrically connected.

2. A method of manufacturing a circuit board in accordance with claim 1, wherein:
   the step of forming said insulating layer includes the step of forming a recessed portion on said exposed major surface of said metal substrate.

3. A method of manufacturing a circuit board in accordance with claim 1, wherein:
   the step of forming said insulating layer includes the step of forming selectively at least one conductor layer, with at least one open space therein, in accordance with a predetermined pattern in said insulating layer.

4. A method of manufacturing a circuit board in accordance with claim 1, comprising the further step of:
   joining and fixedly mounting the electronic component through a metallized layer on the major surface of said metal substrate exposed in the at least one open space of said insulating layer.

5. A method of manufacturing a circuit board in accordance with claim 4, wherein:
   the step of joining and fixedly mounting the electronic component includes the step of joining said electronic component by using a conductive adhesive material.

6. A method of manufacturing a circuit board in accordance with claim 4, wherein:
   the step of joining and fixedly mounting the electronic component includes the step of joining said electronic component by using an insulating adhesive material.

7. A method of manufacturing a circuit board, comprising the steps of:
   preparing a metal substrate having a major surface;
   forming an insulating layer selectively with at least one open space therein, on the major surface of said metal substrate;
   forming a metal layer in the at least one open space of said insulating layer to at least fill an exposed portion of the major surface of said metal substrate, said metal layer being formed to enable at least an electronic component to be mounted thereon; and
   forming a conductor layer selectively, with at least one open space therein, on said insulating layer and said metal layer in accordance with a predetermined pattern, said conductor layer being formed to enable said electronic component to be at least electrically connected.

8. A method of manufacturing a circuit board in accordance with claim 7, wherein:
   the step of forming said metal layer includes the step of making said metal layer even with said insulating layer.

9. A method of manufacturing a circuit board in accordance with claim 7, wherein:
   the step of forming said insulating layer includes the step of forming more than one conductor layer selectively, within said at least one open space in said insulating layer in accordance with a predetermined pattern.

10. A method of manufacturing a circuit board in accordance with claim 7, comprising the further step of:
joining and fixedly mounting the electronic component on said metal layer, with a portion of the electronic component passing through said conductor layer and a metallized layer formed thereon.

11. A method of manufacturing a circuit board in accordance with claim 10, wherein:
the step of joining and fixedly mounting said electronic component includes the step of joining said electronic component by using an electrically conductive adhesive material.

12. A method of manufacturing a circuit board in accordance with claim 10, wherein:
the step of joining and fixedly mounting said electronic component includes the step of joining said electronic component by using an electrically insulating adhesive material.

* * * * *